(12) United States Patent
Kaneko

(10) Patent No.: US 9,293,681 B2
(45) Date of Patent: Mar. 22, 2016

(54) ELECTROCALORIC MATERIAL

(71) Applicant: Panasonic Intellectual Property Management Co., Ltd., Osaka (JP)

(72) Inventor: Yukihiro Kaneko, Osaka (JP)

(73) Assignee: PANASONIC INTELLECTUAL PROPERTY MANAGEMENT CO., LTD., Osaka (JP)

( * ) Notice: Subject to any disclaimer, the term of this patent is extended or adjusted under 35 U.S.C. 154(b) by 0 days.

(21) Appl. No.: 14/537,949

(22) Filed: Nov. 11, 2014

(65) Prior Publication Data
US 2015/0155467 A1 Jun. 4, 2015

(30) Foreign Application Priority Data
Dec. 4, 2013 (JP) .................................. 2013-250817

(51) Int. Cl.
*H01B 1/08* (2006.01)
*H01L 37/00* (2006.01)
*H01L 37/02* (2006.01)
*H01J 29/45* (2006.01)

(52) U.S. Cl.
CPC ................ *H01L 37/025* (2013.01); *H01B 1/08* (2013.01); *H01J 29/458* (2013.01)

(58) Field of Classification Search
CPC ............... H01B 1/00; H01B 1/08; G01J 5/34; G01J 5/046; H01L 37/025; H01J 29/458
See application file for complete search history.

(56) References Cited

FOREIGN PATENT DOCUMENTS

JP 2013-160460 8/2013

OTHER PUBLICATIONS

Tsuji et al "Heat Capacity of (Hf1-yAly)O0.17 at High Temperature", Thermochimica Acta 352-252 (2000) 265-271.*
Stemmer et al "Electron energy-loss spectroscopy study of thin film hafnium aluminates . . . ", Journal of Microscopy, vol. 210, Pt. 1 Apr. 2003, pp. 74-79.*
Mueller et al "Incipient Ferroelectricity in Al-Soped HfO2 Thin Films", Adv. Funct. Mater. 2012, 22, 2412-2417.*
J. F. Scott "Electrocaloric Materials" Annual Review Materials Research, 2011, vol. 41, p. 229-240.
Xinyu Li, et al. "Pyroelectric and electrocaloric materials" Journal of Materials Chemistry C, 2013, vol. 1, p. 23-37.
S Kar-Narayan , et al. "Direct and indirect electrocaloric measurements using multilayer capacitors" J. Phys. D: Appl. Phys. 43 (2010) 032002 (4pp).

* cited by examiner

*Primary Examiner* — Mark Kopec
(74) *Attorney, Agent, or Firm* — McDermott Will & Emery LLP

(57) ABSTRACT

Provided is an electrocaloric material formed of a crystal represented by the composition formula $Hf_{1-x}Al_xO_y$ (where $0.071 \leq x \leq 0.091$ and $y \neq 0$).

8 Claims, 3 Drawing Sheets

ELECTROCALORIC MATERIAL

BACKGROUND

1. Field of the Invention

The present invention relates to a novel electrocaloric material.

2. Description of the Related Art

When an electric field is applied to an electrocaloric material, heat is released from the electrocaloric material to the outside thereof. As a result, the temperature of the electrocaloric material rises. On the other hand, when the application of the electric field to the electrocaloric material is stopped, the temperature of the electrocaloric material lowers. As a result, the electrocaloric material absorbs heat from the outside thereof.

J. F. Scott, "Electrocaloric Materials", Annual Review Materials Research, 2011, Vol. 41, p. 229-240 discloses electrocaloric materials. FIG. 4 is a duplicate of FIG. 3(a) included in J. F. Scott, "Electrocaloric Materials", Annual Review Materials Research, 2011, Vol. 41, p. 229-240. In FIG. 4, the electrocaloric element is in contact with a constant temperature heater which is maintained at approximately 294.8 K. Right after an electric field of 300 kV/cm is applied to the electrocaloric element, the temperature of the electrocaloric element rises to approximately 295.2 K. Since the electrocaloric element is in contact with the constant temperature heater, the temperature of the electrocaloric element gradually returns to approximately 294.8 K. After the temperature of the electrocaloric element returns to 294.8 K, the application of the electric field to the electrocaloric element is stopped. Right after the application of the electric field is stopped, the temperature of the electrocaloric element lowers to approximately 294.4 K. Since the electrocaloric element is in contact with the constant temperature heater, the temperature of the electrocaloric element gradually returns to approximately 294.8 K.

Xinyu Li, et al. "Pyroelectric and electrocaloric materials", Journal of Materials Chemistry C, 2013, vol. 1, p. 23-27 discloses using ceramics and organic materials as the materials of the electrocaloric element.

SUMMARY

The present invention provides an electrocaloric material formed of a crystal represented by the composition formula $Hf_{1-x}Al_xO_y$ (where $0.071 \leq x \leq 0.091$ and $y \neq 0$).

The present invention provides a novel electrocaloric material.

DETAILED DESCRIPTION OF THE EMBODIMENTS

The present inventor found that a hafnium-aluminum complex oxide represented by the composition formula $Hf_{1-x}Al_xO_y$ (where $0.071 \leq x \leq 0.091$ and $y \neq 0$) exhibits an electrocaloric phenomenon, as demonstrated in the examples, which will be described later.

Figure 4:
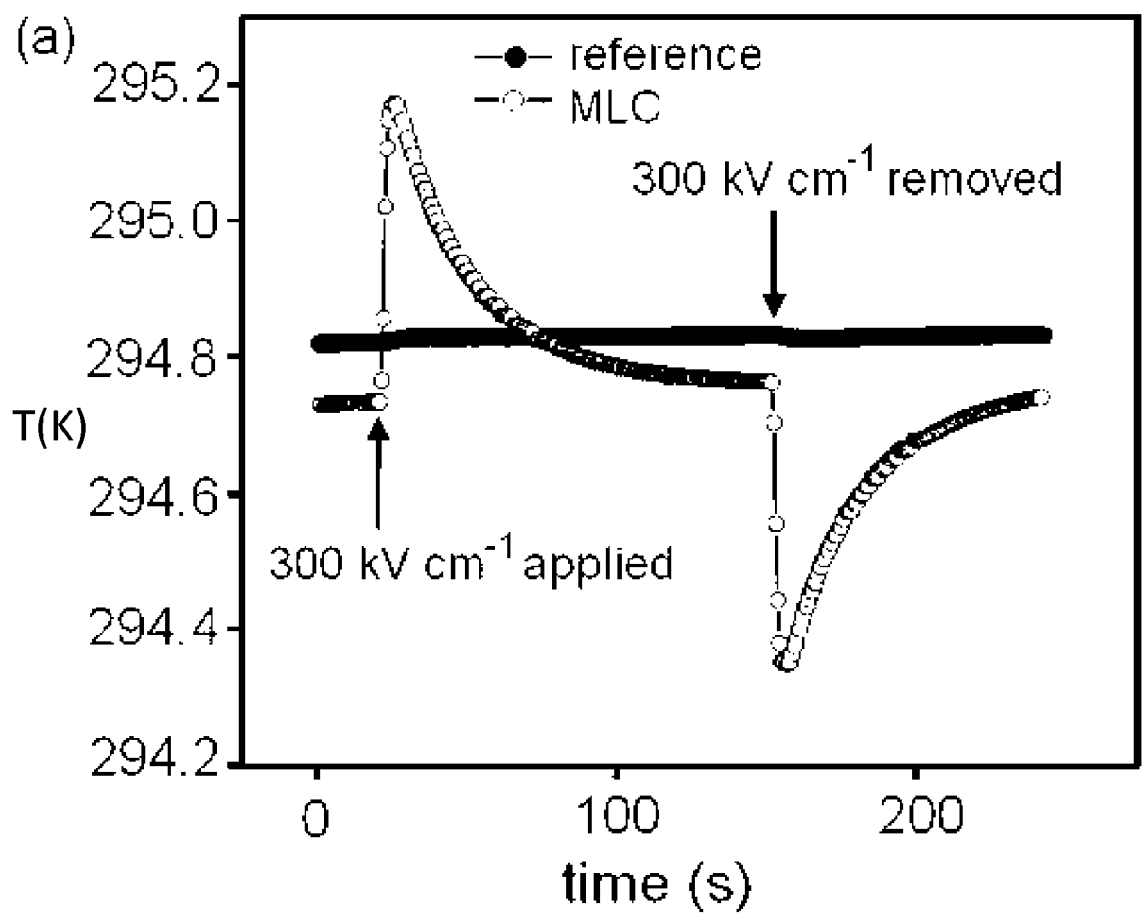
FIG. 4 is a graph cited from FIG. 3(a) included in J. F. Scott, "Electrocaloric Materials", Annual Review Materials Research, 2011, Vol. 41, p. 229-240.

In the instant specification, the electrocaloric element (hereinafter, referred to as "EC element") means an element that produces an electrocaloric effect. Specifically, the temperature of the EC element rises when an electric field is applied to the EC element. On the other hand, when the application of the electric field to the EC element is stopped, the temperature of the EC element lowers. See FIG. 4. Hereinafter, the electrocaloric effect will be described in more detail.

Figure 1A:
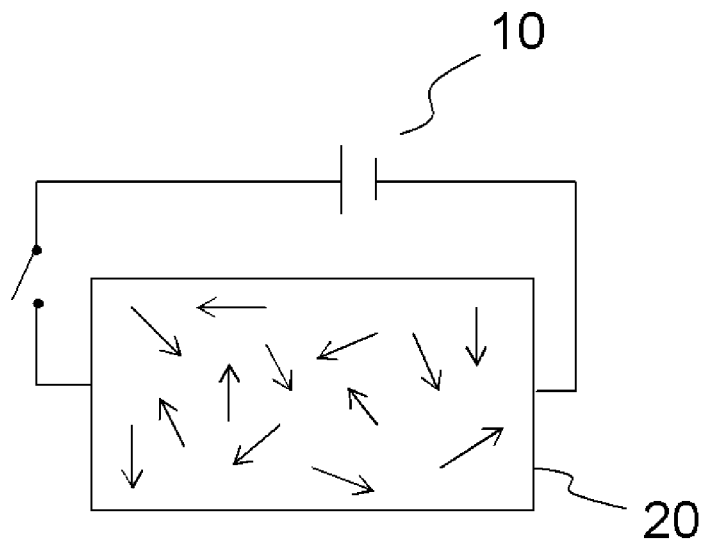
FIG. 1A shows a schematic view of a phenomenon of an electrocaloric effect.
Figure 1B:
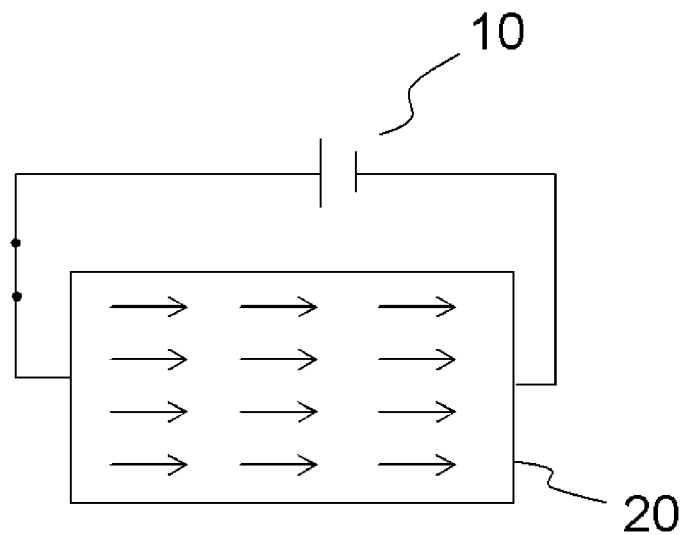
FIG. 1B shows a schematic view of the phenomenon of the electrocaloric effect.

FIG. 1A and FIG. 1B each show a schematic view of the phenomenon of the electrocaloric effect. In FIG. 1A and FIG. 1B, the arrows included in an EC element 20 each indicate a direction of polarization of an electrocaloric material (hereinafter, referred to as "EC material").

In FIG. 1A, no electric field is applied to the EC element 20 from a power supply 10. For this reason, the entropy of the EC element 20 is large. On the other hand, in FIG. 1B, an electric field is applied to the EC element 20 from the power supply 10. For this reason, the entropy of the EC element 20 is small.

When an electric field is applied to the EC element, namely, when the state shown in FIG. 1A is changed to the state shown in FIG. 1B, the entropy of the EC element 20 becomes small. For this reason, the temperature of the EC element 20 rises. On the other hand, when the application of the electric field to the EC element is stopped, namely, when the state shown in FIG. 1B is changed to the state shown in FIG. 1A, the entropy of the EC element 20 becomes large. For this reason, the temperature of the EC element 20 lowers.

Hereinafter, the embodiments of the present invention will be described with reference to the drawings.

(First Embodiment)

Figure 2:
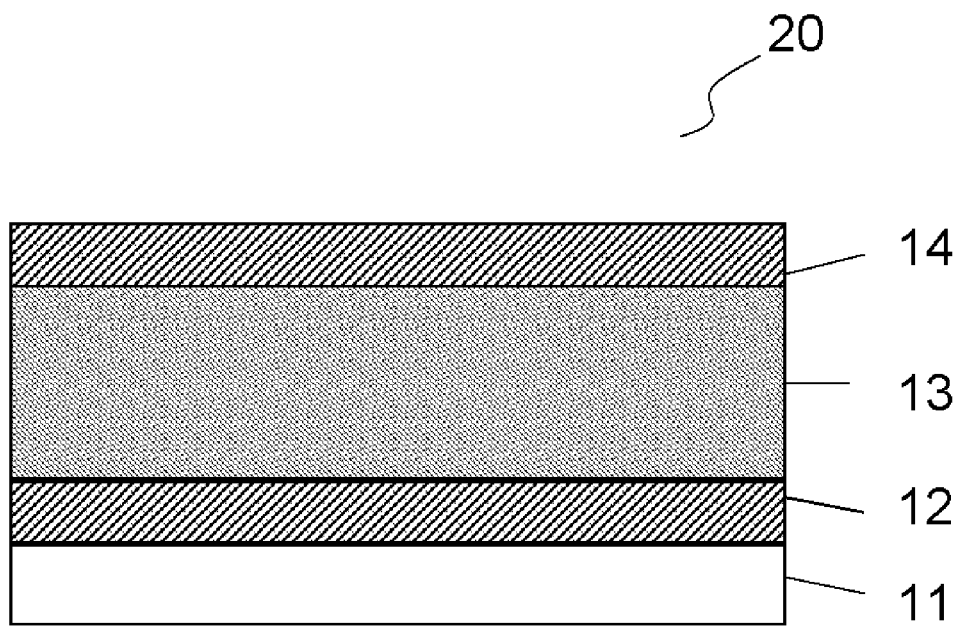
FIG. 2 shows a cross-sectional view of an electrocaloric element according to a first embodiment.

FIG. 2 shows a cross-sectional view of the EC element 20 according to the first embodiment. The EC element 20 comprises a lower electrode 12, an EC material layer 13, and an upper electrode 14 on a substrate 11. The EC material layer 13 is interposed between the lower electrode 12 and the upper electrode 14, as shown in FIG. 2.

An example of the material of the substrate 11 is silicon, glass, or stainless steel.

The lower electrode 12 and the upper electrode 14 are provided on the lower and upper surfaces of the EC material layer 13, respectively, to apply an electric field to the EC material layer 13. An example of the material of each of the lower electrode 12 and the upper electrode 14 is Pt, Au, or Al. The material of the lower electrode 12 may be different from the material of the upper electrode 14. Desirably, each of the lower electrode 12 and the upper electrode 14 is plate-like.

The EC material layer 13 has an electrocaloric effect and contains a hafnium-aluminum complex oxide. More specifically, the EC material layer 13 is formed of a crystal represented by the composition formula $Hf_{1-x}Al_xO_y$ ($0.071 \leq x \leq 0.091$ and $y \neq 0$). Desirably, the EC material layer 13 is composed of a hafnium-aluminum complex oxide. In case where the value of x is less than 0.071, the electrocaloric effect is not exhibited. Also in case where the value of x is more than 0.091, the electrocaloric effect is not exhibited. See the example which will be described later.

The value of y is not limited, as far as the EC material layer 13 has an electrocaloric effect. Desirably, the value of y is not less than 1 and not more than 3. More desirably, the value of y is equal to 2. The value of y may change depending on the amount of oxygen defects included in the EC material layer 13. The oxygen defects included in the EC material layer 13 may be generated at the time of the formation of the EC material layer 13.

The EC material layer 13 may be formed by an atomic layer deposition method.

Figure 3:
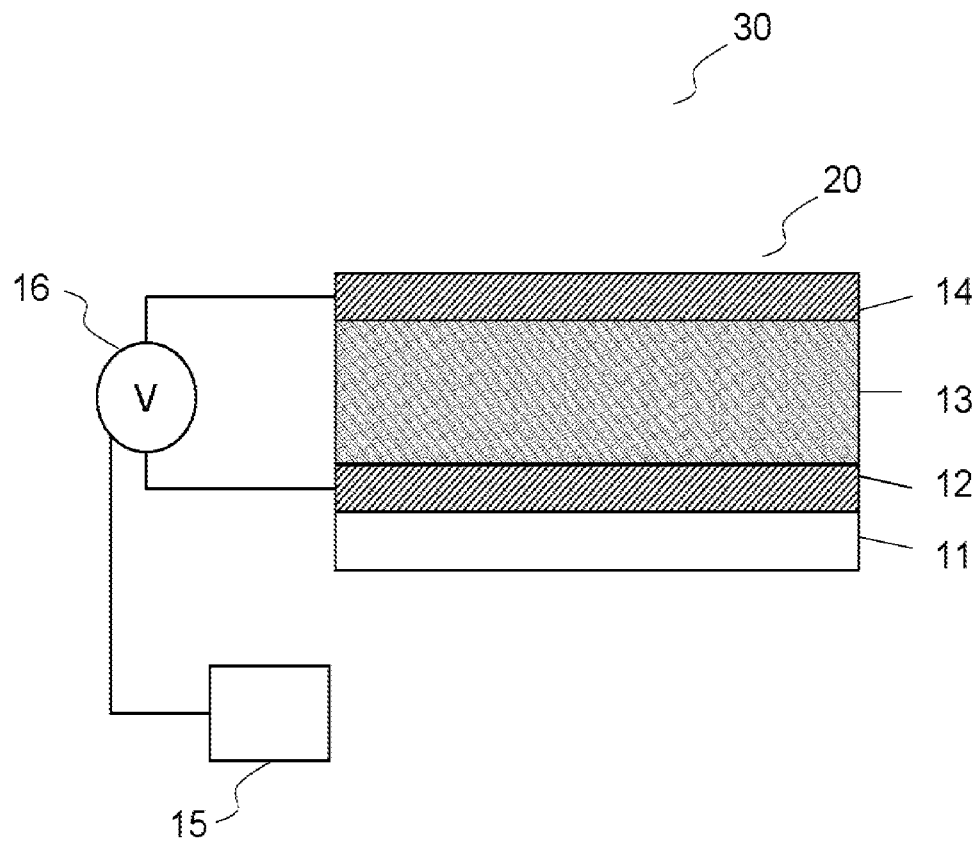
FIG. 3 shows a schematic view of a heating-cooling device according to the first embodiment.

FIG. 3 shows a schematic view of a heating-cooling device 30 according to the first embodiment. The heating-cooling device 30 comprises the EC element 20, a control part 15, and a power supply part 16. When the EC element 20 is heated, the control part 15 transmits to the power supply part 16 a first control signal that makes the power supply part 16 apply an electric field to the EC element 20. The power supply part 16 applies an electric field between the lower electrode 12 and the upper electrode 14 based on the first control signal. When the EC element 20 is cooled, the control part 15 transmits to the power supply part 16 a second control signal that stops the application of the electric filed to the EC element 20. The power supply part 16 stops the application of the electric field between the lower electrode 12 and the upper electrode 14 based on the second control signal. In this way, the control part 15 switches the application of the electric field to the EC material layer 13 between an electric field-off state in which no electric filed is applied to the EC material layer 13 and an electric field-on state in which an electric filed is applied to the EC material layer 13.

EXAMPLE

The present invention will be described in more detail with reference to the following example.

Example 1

EC elements 20 according to the example 1 were fabricated as below.

First, a silicon substrate having a surface covered with a silicon oxide film was prepared as a substrate 11.

Then, a Ti film having a thickness of 5 nanometers was formed by an electron gun deposition method on the substrate 11. Furthermore, a Pt film having a thickness of 30 nanometers was formed by an electron gun deposition method on the Ti film. In this way, a lower electrode 12 composed of the stacked structure of the Ti film and the Pt film was formed.

Then, an EC material layer 13 was formed on the lower electrode 12 as below.

The method for forming the EC material layer 13 included the following steps (i) and (ii).

In the step (i), trimethyl aluminum and water were supplied in this order by an atomic layer deposition method to give an aluminum oxide film.

In the step (ii), tetrakis(ethylmethylamino)hafnium and water were supplied in this order by an atomic layer deposition method to give a hafnium oxide film.

The steps (i) and (ii) were repeated plural times. In the atomic layer deposition method, the lower electrode 12 was heated to 300 degrees Celsius.

In the step (i), while trimethyl aluminum was supplied, water was not supplied. Similarly, while water was supplied, trimethyl aluminum was not supplied. Also in the step (ii), while tetrakis(ethylmethylamino)hafnium was supplied, water was not supplied. Similarly, while water was supplied, tetrakis(ethylmethylamino)hafnium was not supplied.

The composition ratio between Hf and Al is varied by changing the number of times of the steps (i) and (ii). For example, in order to obtain a hafnium-aluminum complex oxide having a composition ratio of Al:Hf=3:1 (namely, x=0.75), the ratio of the number of times of the step (i): the number of times of the step (ii) is set to be 3:1. More specifically, after the step (i) is repeated three times, the step (ii) is performed once. This may be repeated. Alternatively, after the step (i) is repeated six times, the step (ii) is performed twice. This may be repeated.

By such an atomic layer deposition method, the EC material layer 13 formed of a crystal of the hafnium-aluminum complex oxide was formed on the lower electrode 12. By changing the number of times of the steps (i) and (ii), as shown in Table 1, a plurality of the EC material layers 13 each having a different value of x were formed. Each of the formed EC material layers 13 had a thickness of 16 nanometers.

Then, each of the EC material layers 13 was heated to 1,000 degrees Celsius under an argon atmosphere using a rapid heating device. The heating time was 20 seconds. Next, a Pt film having a thickness of 100 nanometers was formed by an electron gun deposition method on each of the EC material layers 13. In this way, an upper electrode 14 was formed. The upper electrode 14 had an area of 0.0001 cm$^2$. In this way, the EC elements 20 were fabricated.

Heating-cooling ability of the EC element 20 at 50 degrees Celsius was measured as below. First, the EC element 20 was put on a constant temperature heater. The EC element 20 was heated to 50 degrees Celsius using the constant temperature heater. Then, the temperature of the EC element 20 was maintained at 50 degrees Celsius.

Under the environment where the temperature was maintained at 50 degrees Celsius, the temperature of the surface of the upper electrode 14 was measured in the state where no electric field was applied. Next, under the environment where the temperature was maintained at 50 degrees Celsius, the temperature $T_1$ of the surface of the upper electrode 14 was measured right after a voltage of 3.2 volts was applied to the EC element 20.

After the temperature of the surface of the upper electrode 14 had returned to 50 degrees Celsius, the application of the voltage of 3.2 volts to the EC element 20 was stopped. The temperature $T_2$ of the surface of the upper electrode 14 was measured right after the application of the voltage of 3.2 volts to the EC element 20 was stopped.

The following Table 1 shows these results.

TABLE 1

| Value of x | $T_1$ | $T_2$ |
|---|---|---|
| 0.000 | 50 degrees Celsius | 50 degrees Celsius |
| 0.032 | 50 degrees Celsius | 50 degrees Celsius |
| 0.048 | 50 degrees Celsius | 50 degrees Celsius |
| 0.063 | 50 degrees Celsius | 50 degrees Celsius |
| 0.071 | 53.6 degrees Celsius | 46.4 degrees Celsius |
| 0.077 | 61.2 degrees Celsius | 38.8 degrees Celsius |
| 0.091 | 51.3 degrees Celsius | 48.7 degrees Celsius |
| 0.100 | 50 degrees Celsius | 50 degrees Celsius |

As is clear from Table 1, if the value of x is not less than 0.071 and not more than 0.091, the crystal of the hafnium-aluminum complex oxide represented by the composition formula $Hf_{1-x}Al_xO_y$ exhibits an EC effect. In Table 1, the description "50 degrees Celsius" means a temperature of more than 49.5 degrees Celsius and not more than 50.5 degrees Celsius.

The EC elements 20 accrodng to the example 1 each had a breakdown voltage of approximately 19 volts. This breakdown voltage is equivalent to an electric field intensity of approximately 12 MV/cm. Accordingly, it is understood that the EC elements 20 accrodng to the example 1 have several hundred times larger breakdown voltage than a conventional EC element.

The temperature change of the EC element increases with an increase in the voltage applied to the EC element. In the present example, the voltage of 3.2 volts was applied to the EC element. However, in a case where a voltage near the breakdown voltage is applied to the EC element, the temperature change of the EC element is expected to be greater than the value of (the temperature $T_1$ – the temperature $T_2$), both of which are shown in Table 1. As just described, the EC element 20 according to the first embodiment is expected to have a higher heating-cooling ability than a conventional EC element.

The EC material layers 13 according to the present example each had a thickness of 16 nanometers and a breakdown voltage equivalent to the electric field intensity of approximately 12 MV/cm. The EC material layers 13 according to the present example each are thinner and have higher insulation properties than a conventional EC element.

INDUSTRIAL APPLICABILTY

The electrocaloric material according to the present invention is useful for a cooling device.

REFERENTIAL SIGNS LIST 10 power supply
11 substrate
12 lower electrode
13 EC material layer
14 upper electrode
15 control part
16 power supply part
20 EC element
30 heating-cooling device

The invention claimed is:

1. An electrocaloric material formed of a crystal represented by the composition formula $Hf_{1-x}Al_xO_y$ (where $0.071 \leq x \leq 0.091$ and $y \neq 0$).

2. The electrocaloric material according to claim 1, wherein
the value of y is not less than 1 and not more than 3.

3. An electrocaloric element, comprising:
an electrocaloric material formed of a crystal represented by the composition formula $Hf_{1-x}Al_xO_y$ (where $0.071 \leq x \leq 0.091$ and $y \neq 0$); and
a pair of electrodes provided on the electrocaloric material.

4. The electrocaloric element according to claim 3, wherein
the value of y is not less than 1 and not more than 3.

5. A heating-cooling device, comprising:
an electrocaloric material formed of a crystal represented by the composition formula $Hf_{1-x}Al_xO_y$ (where $0.071 \leq x \leq 0.091$ and $y \neq 0$);
a pair of electrodes provided on the electrocaloric material;
a power supply part for applying an electric field between the pair of electrodes; and
a control part for switching application of the electric field to the electrocaloric material between a first state that no electric field is applied to the electrocaloric material and a second state that an electric field is applied to the electrocaloric material.

6. The heating-cooling device according to claim 5, wherein
the value of y is not less than 1 and not more than 3.

7. A method for heating and cooling an electrocaloric material, the method comprising the steps of:
(a) applying an electric field to an electrocaloric material formed of a crystal represented by the composition formula $Hf_{1-x}Al_xO_y$ (where $0.071 \leq x \leq 0.091$ and $y \neq 0$) to heat the electrocaloric material, and
(b) stopping the application of the electric field to the electrocaloric material after the step (a) to cool the electrocaloric material.

8. The method according to claim 7, wherein
the value of y is not less than 1 and not more than 3.

* * * * *